United States Patent [19]

Olbright et al.

[11] Patent Number: 5,266,794
[45] Date of Patent: Nov. 30, 1993

[54] VERTICAL-CAVITY SURFACE EMITTING LASER OPTICAL INTERCONNECT TECHNOLOGY

[75] Inventors: Gregory R. Olbright, Boulder, Colo.; Jack L. Jewell, Bridgewater, N.J.

[73] Assignee: Bandgap Technology Corporation, Broomfield, Colo.

[21] Appl. No.: 823,418

[22] Filed: Jan. 21, 1992

[51] Int. Cl.$^5$ .............................................. H01J 31/50
[52] U.S. Cl. .............................. 250/214 LS; 250/551; 257/82
[58] Field of Search ............ 250/211 J, 551, 213 A, 250/214 LS; 307/311; 372/45; 357/19; 257/80, 81, 82, 83

[56] References Cited

U.S. PATENT DOCUMENTS

| | | | |
|---|---|---|---|
| 4,533,833 | 8/1985 | Copeland et al. | 250/551 |
| 4,612,670 | 9/1986 | Henderson | 250/551 |
| 4,949,350 | 8/1990 | Jewell et al. | 372/45 |
| 4,952,791 | 8/1990 | Hinton et al. | 250/213 A |
| 4,999,842 | 3/1991 | Huang et al. | 372/45 |
| 5,034,344 | 7/1991 | Jewell et al. | 437/129 |

OTHER PUBLICATIONS

Goodman et al., "Optical Interconnections for VLSI Systems," *Proc. IEEE*, vol. 72, 1984, pp. 850–866.
Kostuk et al., "Optical Imaging Applied to Microelectronic Chip-to-Chip Interconnections," *Appl. Opt.*, vol. 24, 1985, pp. 2851–2858.
Yu et al., "Surface Emitting Lasers for Optical Circuitry—Optical Interconnect Technology," *SPIE vol. 886 Optoelectronic Signal Processing for Phased-Array Antennas*, 1988, pp. 1–11.
Hendricks et al., "Optical Backplane Interconnect for Data Processors," *IEEE Proceedings-1989 Southeastcon*, Session 12B5, 1989, pp. 1132–1139.
Jewell et al., "Vertical Cavity Lasers for Optical Interconnects," *SPIE vol. 1389 International Conference on Advances in Interconnection and Packaging*, 1990, pp. 401–407.
J. Jahns, "Integrated Packaging of Optical Backplanes," *SPIE vol. 1389 International Conference on Advances in Interconnection and packaging*, 1990, pp. 523–526.
Dickinson et al., "Free Space Optical Interconnect Using Microlasers and Modulator Arrays," *SPIE vol. 1389 International Conference on Advances in Interconnection and Packaging*, 1990, pp. 503–514.
Yoo et al., "Low Series Resistance Vertical-Cavity Front-Surface-Emitting Laser Diode," *Appl. Phys. Letters*, vol. 56, No. 20, May, 1990, pp. 1942–1945.
Olbright et al., "Cascadable Laser Logic Devices: Discrete Integration of Phototransistors with Surface Emitting Laser Diodes," *Electronics Letters*, vol. 27, No. 3, Jan. 31, 1991, pp. 216–217.
Jewell et al., "Vertical-Cavity Surface-Emitting Lasers: Design, Growth, Fabrication, Characterization," *IEEE Journal of Quantum Electronics*, vol. 27, No. 6, Jun. 1991, pp. 1332–1346.
Jewell et al., "Microlasers," *Scientific American*, vol. 265, No. 5, Nov. 1991, pp. 86–96.

*Primary Examiner*—David C. Nelms
*Attorney, Agent, or Firm*—Pennie & Edmonds

[57] ABSTRACT

A three-dimensional optical interconnection is disclosed having a stack of vertically aligned optoelectronic integrated (OEIC) modules. Each OEIC module includes an array of vertical cavity surface emitting lasers (VCSEL), receivers and electronic logic which are monolithically integrated on a single semiconductor substrate. Communication between the OEIC modules is effectuated by the free space propagation of laser radiation from the VCSELs to corresponding receivers on an adjacent OEIC module. Transistors, such as heterojunction bipolar transistors, may be used to drive the VCSELS.

22 Claims, 6 Drawing Sheets

VERTICAL-CAVITY SURFACE EMITTING LASER OPTICAL INTERCONNECT TECHNOLOGY

CROSS-REFERENCE TO RELATED APPLICATION

This application is related to U.S. application Ser. No. 07/823,496, which was filed concurrently herewith, and U.S. application Ser. No. 07/790,964 which was filed on Nov. 7, 1991.

FIELD OF THE INVENTION

The present invention relates to the field of optical interconnection and, in particular, to a three dimensional array of monolithically integrated surface emitting lasers and receivers used to implement optical interconnects between vertically stacked optoelectronic integrated circuit modules.

BACKGROUND OF THE INVENTION

The current overriding limitation in the operating speed of all-electronic processors is primarily due to the problems associated with physical wiring. For example, all-electronics processors use physical wiring, such as co-planar metallic strip lines that suffer from an impedance mismatch with electronic logic devices. Such an impedance mismatch leads to a large power consumption as well as a low operating speed. Furthermore, the communication speed between electronic elements is critically dependent on the characteristic R-C time constant of the interconnecting metallic wires.

While alternative interconnection architectures have improved the operating speeds of some processor systems, they have not been completely satisfactory in effectively reducing the R-C time constant when the dimensions of the devices are further reduced. This can be best understood by realizing that while the parasitic capacitance, C, decreases with size, the resistance, R, does not, but rather increases, maintaining the R-C time constant relatively fixed.

Also problematic is the noise associated with the utilization of physical wiring. Generally, whenever the signal through a loop of strip-line connections changes, a voltage spike is generated. For digital systems, costly and complex error reduction techniques must be employed to compensate for the noise in order to achieve the desired bit-error rate. Additionally, communication among the hundreds or even thousands of electronic logic devices found on VLSI integrated circuits is generally serial, resulting in the classic Von Neumann bottleneck problem.

One solution to the impedance mismatch and Von Neumann bottleneck problems is the implementation of optoelectronic interconnects. See, for example, Goodman, J. W., et al., *Appl. Opt.*, Vol. 27, pp. 1742 (1988), and Kostuk, R. K., et al., *App. Opt.*, Vol. 24 (1985), which are incorporated herein by reference. Optoelectronic interconnects act as quantum impedance matching elements that use optical beams for establishing interconnects or communication paths between electronic elements in order to avoid mismatching and bottlenecking. Unlike physical wiring, these impedance matching elements, such as lasers and photo-receivers, convert electrons to photons and then photons back to electrons in establishing the interconnects. Advantageously, optical beams do not strongly interact with each other, thereby also substantially improving the noise immunity. Moreover, for optical interconnects, the power and bandwidth requirements do not depend on distance as do physical wires.

Considerable efforts concerning the architecture of such optoelectronic interconnects have been expended. For instance, recently proposed architectures include the use of two-dimensional arrays of surface emitting laser diodes and detector arrays integrated on a single semiconductor substrate as set forth, for example, in J. L. Jewell et al., *SPIE International Conference on Advances in Interconnection and Packaging*, Vol. 1389, pp. 401–407 (1990); J. Jahns, *SPIE International Conference on Advances in Interconnection and Packaging*, Vol. 1389, pp. 523–526 (1990); A. G. Dickinson et al., *SPIE International Conference on Advances in Interconnection and Packaging*, Vol. 1389, pp. 503–514 (1990); H. D. Hendricks et al., *IEEE Proceedings—1989 Southeastcon*, Session 12B5, pp. 1132–1139; and P. K. L. Yu et al., *SPIE Optoelectronic Signal Processing for Phased-Array Antennas*, Vol. 886, pp. 1–11 (1988), all of which are incorporated herein by reference.

A problem that remains in the prior art is to provide an interconnection architecture which (1) utilizes high speed, efficient optoelectronic integrated circuit (OEIC) transmitters/receivers, (2) utilizes an OEIC interconnect technology compatible with three-dimensional hybrid opto electronics signal processing systems, and (3) is suitable for fabrication and capable of rigid intrastack optical interconnect alignment.

SUMMARY OF THE INVENTION

These and other objects are achieved in accordance with the invention, which is a three-dimensional optical interconnection suitable for realizing three-dimensional optoelectronic processors. The three-dimensional optical interconnection comprises a stack of vertically aligned optoelectronic integrated circuit (OEIC) modules, each including electronic logic connected to transmitters and receivers. In this optical interconnection architecture, the electronic logic used for electronic processing are monolithically integrated with the transmitters and receivers on a semiconductor substrate using standard semiconductor growth and processing techniques.

In a preferred embodiment of the invention, each vertically aligned OEIC module comprises GaAs logic devices, transmitters and receivers all fabricated on a single GaAs substrate. More particularly, the transmitter comprises a heterojunction bipolar transistor (HBT) integrated vertically to a vertical cavity surface emitting laser (VCSEL), whereas the receiver comprises a heterojunction photo transistor (HPT). With the HBTs and HPTs designed to have the same epitaxial layering or structure, this configuration not only minimizes the complexity of the fabrication processing, but also allows each structure to function as either a transmitter or receiver.

Output signals from the GaAs logic devices are connected to corresponding HBTs and then amplified to drive the VCSELs above threshold and into lasing, as well as to modulate the information from the output signals onto the emitted radiation. The optical radiation which emerges perpendicular to the plane of the substrate is transmitted vertically to the next adjacent OEIC module. With the wavelength of the optical radiation designed to be in the transmissive band of the GaAs substrate, the optical radiation is transmitted through the substrate to a corresponding receiver, the HPT, for detection and amplification. The amplified signal is routed by metallic interconnections to electronic circuitry for further electronic processing. Such transmission and reception between OEIC modules establish communication paths or interconnections between adjacent OEIC modules.

BRIEF DESCRIPTION OF THE DRAWING

A more complete understanding of the invention may be obtained by reading the following description in conjunction with the appended drawings in which.

DETAILED DESCRIPTION

The present invention is based on utilizing high-speed vertical-cavity surface emitting lasers (VCSELs) that are integrated with transistors and high-density electronic logic to form three-dimensionally interconnectable optoelectronic integrated circuit (OEIC) modules. Particularly, the size, speed and structure of the VCSELs afford high-speed optical interconnections to be realized by vertically stacking OEIC modules that contain the array of VCSELs. Communication between the OEIC modules is effectuated, preferably, by the free space propagation of laser radiation between VCSELs and corresponding receivers on adjacent OEIC modules.

Figure 1:
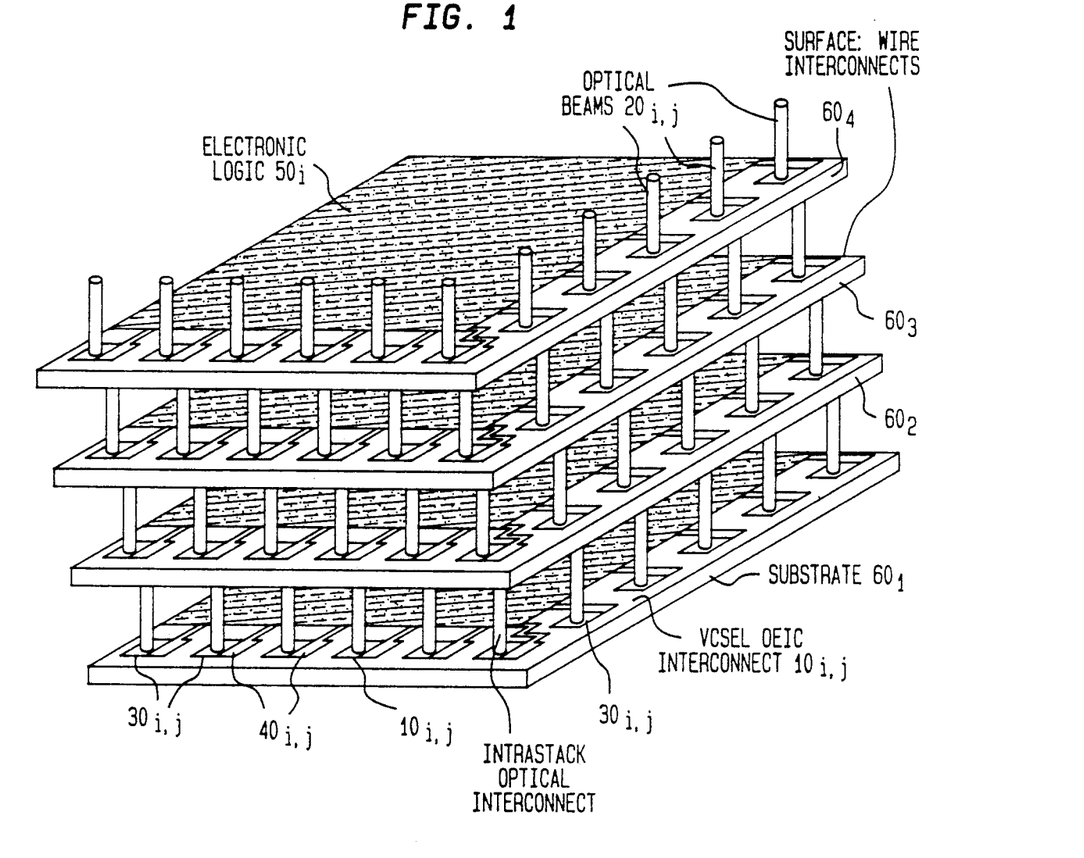
FIG. 1 is an exemplary three dimensional optical interconnection architecture in accordance with the principles of the invention.

The basic concept of the three-dimensional optical interconnection is illustrated for a four stack system in FIG. 1. At each OEIC interconnect or node $10_{i,j}$, an array of elements is used to generate, transmit and receive optical signals or beams $20_{i,j}$, where i denotes the OEIC module and j denotes the element number. OEIC interconnects/or nodes on each module are substantially arranged in the same pattern. Moreover, the OEIC modules are vertically stacked and aligned such that nodes on one module are substantially underneath those on adjacent modules as illustrated in FIG. 1. That is, all $j^{th}$ element nodes are substantially aligned in a vertical path.

Each array of elements comprises a transmitter $30_{i,j}$ used to generate modulated light beam $20_{i,j}$ that provides a connection to another OEIC interconnect or node on an adjacent module and a receiver $40_{i,j}$ used to receive modulated light beam or optical signal $20_{i,j}$ carrying data or information. In this manner, optical interconnections between transmitters $30_{i,j}$ and receivers $40_{i+1,j}$ and/or $40_{i-1,j}$ can be established. For example, transmitter $30_{4,1}$ can be optically interconnected to receiver $40_{3,1}$ and/or $40_{5,1}$. Integrating transmitters $30_{i,j}$ and receivers $40_{i,j}$ with electronic logic $50_i$, such as combinational and sequential logic devices, further allows three-dimensional hybrid processors to be realized.

It will be apparent to those skilled in the art that some of these interconnections may be disabled by electronically disabling the associated transmitters to establish any predetermined interconnection scheme. Furthermore, it should be realized, of course, that optical interconnections between transmitters $30_{i,j}$ and receivers $40_{i,j}$ can be implemented with use of fibers or bulk optics such as optical imaging relay systems.

It is anticipated that GaAs based electronic logic will be utilized instead of the more mature silicon technology because of the difficulty in the growth and fabrication of the optical and opto electronics devices on silicon substrates. Moreover, the primary advantage of integration density for the dominant Si integrated circuit technology (CMOS) over the dominant GaAs integrated circuit technology (enhancement-mode drain-coupled FET logic) is not specifically relevant for the present three-dimension optical interconnection architecture. Without the current-drive penalty associated with driving high input/output capacitance, and the avoidance of the Von Neumann bottleneck, the impetus toward very large scale integration (VLSI) is substantially obviated.

Referring again to FIG. 1, the three-dimensional optical interconnection of the present invention comprises at least a stack of vertically aligned substrates $60_1$ through $60_4$, preferably of GaAs. As will become apparent in the following description below, each substrate level constitutes an OEIC module, which for the sake of simplicity will have the same numeral designation as the corresponding substrate. The OEIC module will be referred to as $60_i$, where i denotes the element numeral of the OEIC module in conformance with the notation designated above herein. Each OEIC module $60_i$ includes electronic logic $50_i$, transmitters $30_{i,j}$ and receivers $40_{i,j}$, which are monolithically integrated on a corresponding substrate $60_i$ using standard semiconductor growth and processing techniques, which are well known in the art.

As shown, transmitters $30_{i,j}$ and receivers $40_{i,j}$ are located on the perimeter of substrates $60_i$ and are arranged in a desired pattern. It should, however, be understood that transmitters $30_{i,j}$ and receivers $40_{i,j}$ may alternatively be fabricated in a different geometry or pattern, depending on the system application. For example, they may be distributed more uniformly over the OEIC chip area, and the transmitters might be placed a distance away from the receivers.

Each of transmitters $30_{i,j}$ comprises a transistor, such as a heterojunction bipolar transistor (HBT) or field effect transistor (FET), integrated with a vertical cavity surface emitting laser (VCSEL). Unlike edge-emitting lasers, VCSELs emit laser radiation in the direction perpendicular to the plane of the p-n junction formed therein. For a detailed discussion of VCSELs, see, for example, U.S. Pat. No. 4,949,350; J. Jewell et al., *Scientific American*, Vol. 265, No. 5, pp. 86–94 (November 1991); and J. Jewell et al., *IEEE Journal of Quantum Electronics*, Vol. 27, No. 6, pp. 1332–1346, (June 1991), which are incorporated herein by reference.

Output signals of each of electronic logic $50_i$ are connected, preferably, to a HBT which amplifies the output signals of electronics logic $50_i$ in order to drive the VCSELs above threshold and into lasing. The laser outputs from the VCSELS or optical beams $20_{i,j}$ are modulated according to the amplitude of the amplified output signals and thus contain information carried by the output signals from electronic logic $50_i$. Each of receivers $40_{i,j}$ comprises a heterojunction photo transistor (HPT) that detects and amplifies an optical beam $20_{i,j}$ from an adjacent OEIC module that impinges on the photo-absorptive region of receiver $40_{i,j}$ at a wavelength $\lambda_S$. For the particular device structure described below, $\lambda_S$ is chosen to be greater than approximately 0.88 μm because, among other reasons, the GaAs semiconductor substrate $60_i$ is transparent for those wavelengths.

Optical beams $20_{i,j}$ which emerge perpendicular to the substrate are transmitted vertically to the next OEIC module so that each may be detected by corresponding receiver. The high-power electrical output of the HPT is connected to the input of several GaAs logic devices of electronic logic $50_i$ for further processing; then, routed to a transmitter for interconnecting, if desired, to an another adjacent OEIC module. Similarly, each subsequent OEIC module containing transmitters, receivers and electronic logic can communicate with an adjacent OEIC module such that three-dimensional, intrastack optical interconnects can be establish between adjacent OEIC modules and, if desired, among all OEIC modules. Those skilled in the art will known of the appropriate functional circuits for electronic logic $50_i$ as well as the appropriate interconnection patterns between each adjacent module to construct, for example, powerful optoelectronic signal processors.

With the speeds of VCSELs approximately an order of magnitude higher than the mature strip-line interconnect speeds, it is envisaged that optically interconnected processors can be realized to operate at multi-Ghz clock speeds rather than the 100 Mhz clock speeds of most all-electronic processors.

In order to better understand the three-dimensional optical interconnection of the present invention, the device structures for transmitters $30_{i,j}$ and receivers $40_{i,j}$ will be discussed below as well as their integration on semiconductor substrates $60_i$.

Figure 2:
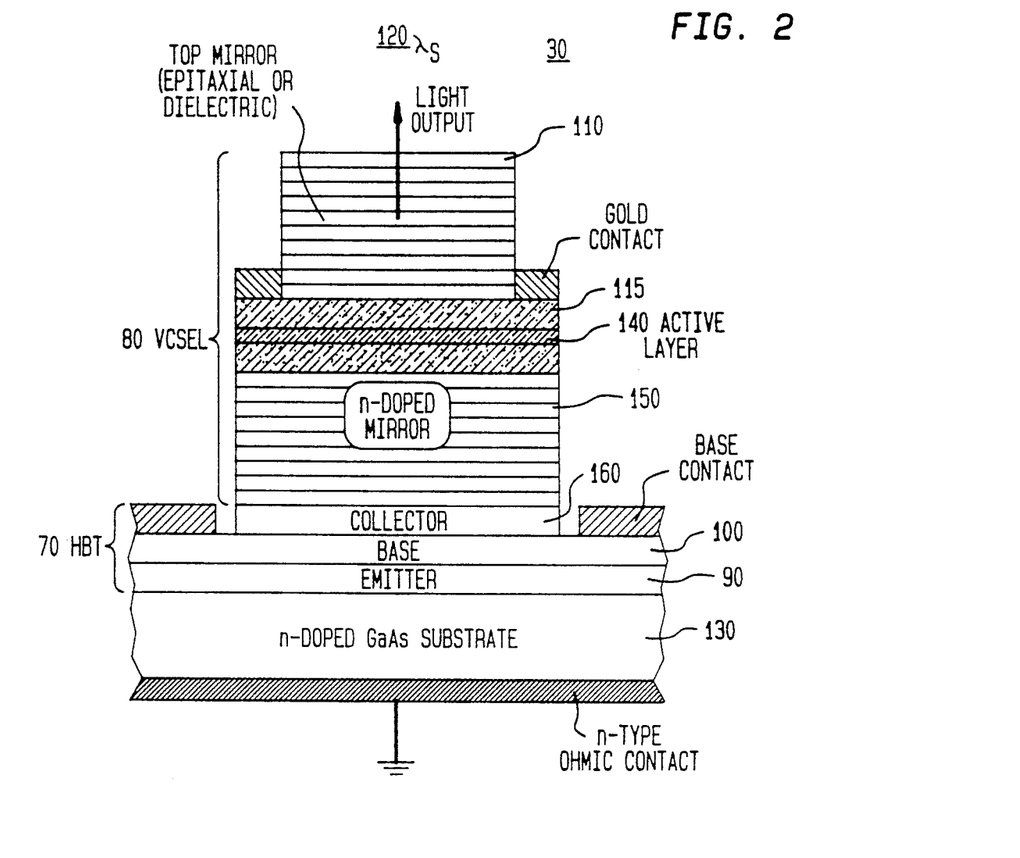
FIG. 2 is a cross-section of a preferred embodiment of a transmitter having a monolithically integrated heterojunction photo transistor and vertical cavity surface emitting laser.

As shown in FIG. 2, the preferred embodiment of the three dimensional optical interconnection of the present invention utilizes a monolithically integrated HBT 70 and VCSEL 80 for each of transmitters $30_{i,j}$. The operation of HBTs is well known in the art and accordingly is not discussed in detailed here.

Transmitters $30_{i,j}$ are three-terminal devices, each having connections to a emitter layer 90, a base layer 100, and a distributed Bragg reflector 110 (or p-type conductive layer 115) from VCSEL 80. In operation, a low-power output signal from electronic logic $50_i$ is connected, for example, via co-planar striplines, to base layer 100 of HBT 70 in the presence of a DC bias across the distributed Bragg reflector 110 and emitter layer 90. When the output signal of the electronic logic is in the on-state, the low-power output is amplified by HBT 70. For example, typical low-power output signals of a few hundred μW may be amplified to several hundred milliwatts.

Figure 3:
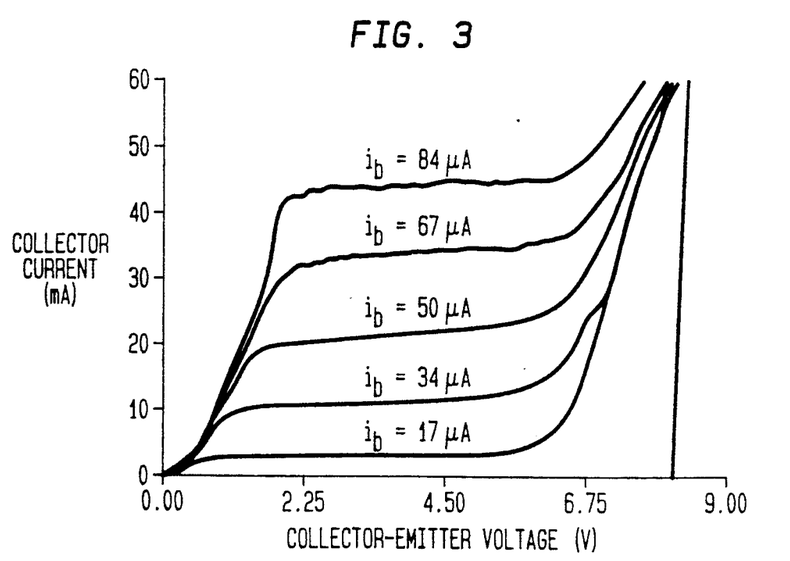
FIG. 3 is a plot of the collector current versus collector-emitter voltage characteristics for several base injection currents of an exemplary heterojunction bipolar transistor used in the three dimensional optical interconnection of FIG. 1.

More specifically, HBT 70 functions as a power amplifier. Low-power signals to HBT 70 are amplified with gains typically exceeding 1600. Due to the large gain of HBT 70, it is possible for HBT 70, if desired, to drive tens of VCSELs in order to achieve large fanouts. Preferably, emitter layer 90 is of an n-type conductivity, base layer 100 of a p-type conductivity with a narrow bandgap energy, and collector layer 160 of a n-type conductivity also with a narrow bandgap energy. In operation, a bias voltage is applied across collector layer 160 and emitter layer 90 and a small current from the electronic logic injected independently at base layer 100 so as to extract a large current from collector layer 160. FIG. 3 is a plot of the collector current versus collector-emitter voltage for several base injection currents of a typical HBT.

Alternatively, transmitters $30_{i,j}$ can comprise a FET and VCSEL monolithically integrated on a substrate $60_i$. Similarly, the FET, with the exception that is a voltage controlled device, amplifies the low power output signal of the electronic logic sufficient to drive the VCSEL. This type of structure is described in co-pending U.S. patent Ser. No. 823,496, which is incorporated herein by reference.

VCSEL 80 emits laser radiation 120 perpendicular to the plane of substrate 130. Advantageously, VCSEL 80 can be fabricated using conventional integrated-circuit processing techniques and, moreover, can be individually addressed such that electrically addressable configurable optical interconnections can be realized.

VCSEL 80 comprises an active region 140, such as one or more quantum wells, sandwiched between mirrors 110 and 150 which may be grown by molecular beam epitaxy (MBE). Typically, such mirrors are distributed Bragg reflectors (DBRs) consisting of alternating quarter wavelength layers of, for example, AlAs and AlGaAs, dependent on the semiconductor material system used for the quantum well. In operation, injection current is typically confined within the active region, such as by use of an annular shaped proton implanted region or mesa structure, to achieve stimulated emission. Details of the use of ion implantation for such current funneling are set forth in Y. H. Lee, et al., *Electronics Letters*, Vol. 26, pp. 1308–1310 (1990), which is incorporated herein by reference.

It should, however, be understood that electrical pumping is achieved by doping bottom mirror 150 and substrate 130 to one conductivity type, e.g., n-type, and doping the regions of upper mirror 110 with the opposite conductivity, e.g., p-type, to form a diode structure and applying a suitable voltage to the diode structure.

Alternatively, it is contemplated that substrate 130 be undoped. In this case, either a ground plane at the base of the VCSEL or electrical connections from the bottom of the substrate to the device level is needed so that the suitable voltage can be applied to the diode structure.

In the prior art, VCSELs have been designed to emit in the wavelength range of 770–1100 nm with very low drive currents and voltages that are compatible with either analog or digital integrated CMOS or TTL electronic circuits. Unlike conventional edge-emitter lasers that are fabricated with a 45 degree-facet mirror, VCSELs can be fabricated in extremely small sizes, for example, on the order of one micrometer in diameter.

Figure 4:
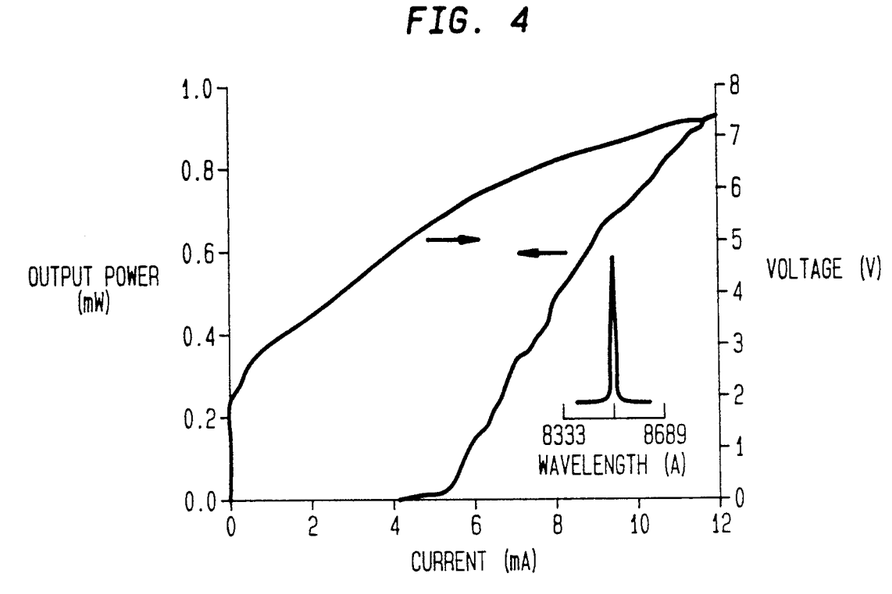
FIG. 4 are illustrative plots of the voltage versus current (I-V) and light versus current (L-I) characteristics for an exemplary vertical cavity surface emitting laser used in the three dimensional optical interconnection of FIG. 1.

Shown in FIG. 4 are illustrative plots of the voltage versus current (I-V) and light versus current (L-I) characteristics for a VCSEL having a 10 μm diameter and operating at wavelength of 850 nm.

Further, an array of VCSELs 80 can easily be fabricated by depositing epitaxially the semiconductor layers of the VCSEL and then defining by optical photolithography and etching a plurality of columns, each a separate VCSEL, as described below.

It is contemplated that for the present integrated HBT and VCSEL, that the semiconductor layers for the VCSEL active region will be selected from the GaAs/InGaAs system, and that the semiconductor layers for the HBT will be selected from the GaAs/AlGaAs system. Preferably, a n-p-n structure is contemplated for the HBT and thus requires that the HBT be grown next to n-type conductivity mirror of the VCSEL. The HBT, moreover, can be fabricated in a "HBT-up", "HBT-down", vertically stacked or side-by-side geometrical configurations. Standard fabrication techniques including molecule beam epitaxy (MBE), selective wet chemical etching, reactive ion etching, ion implantation, ion diffusion and contact metalization may be used to fabricate the transmitter in accordance with the principles of the invention.

Figure 5:
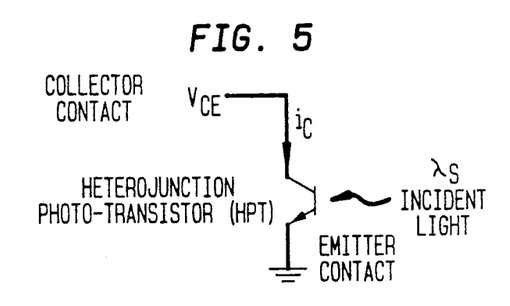
FIG. 5 is a circuit configuration for an exemplary heterojunction photo transistor used in the three dimensional optical interconnection of FIG. 1.
Figure 6:
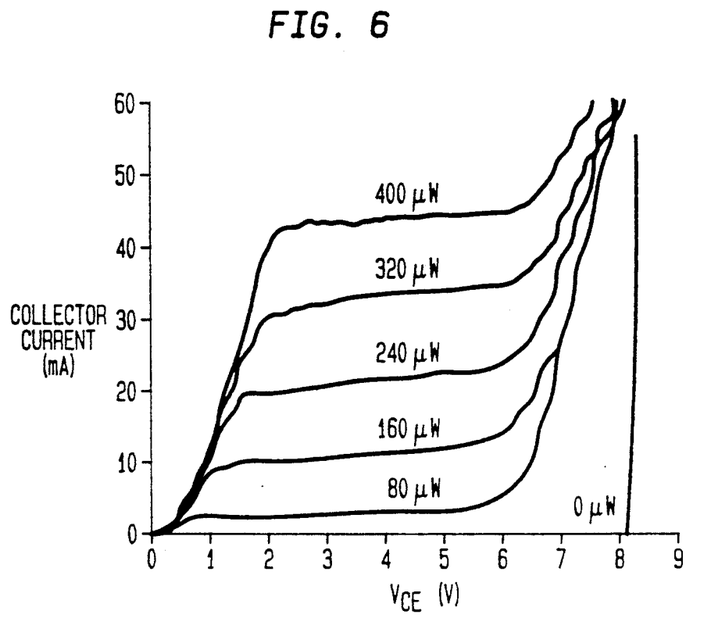
FIG. 6 is a plot of the collector current versus collector-emitter voltage for several incident power levels for an exemplary heterojunction photo transistor used in the three dimensional optical interconnection of FIG. 1.

Each of receivers $40_{i,j}$ comprises a HPT. The same epilayers used to construct high-gain HBT 70 will be utilized for the HPT epilayers, but operated in a two-terminal floating base configuration. The HPT will be capable of receiving optical radiation originating from upper or lower adjacent OEIC modules of the three dimensional optical interconnection. In operation, incident light propagates through transparent emitter 90 and is absorbed in base and collector layers 100 and 160, respectively, resulting in the photo-generation of current. This photo-generated current is amplified by the high-gain of the device because of the heterojunction interface present in the structure. It is anticipated that a responsivity greater than approximately 100 A/W will be achieved. Shown in FIGS. 5 and 6 are the circuit configuration and illustrative set of current-voltage curves for various incident power levels of a typical HPT, respectively. For example, from FIG. 6, it can be seen that for an incident power of 240 μW more than 20 mA of current will be generated.

Figure 7:
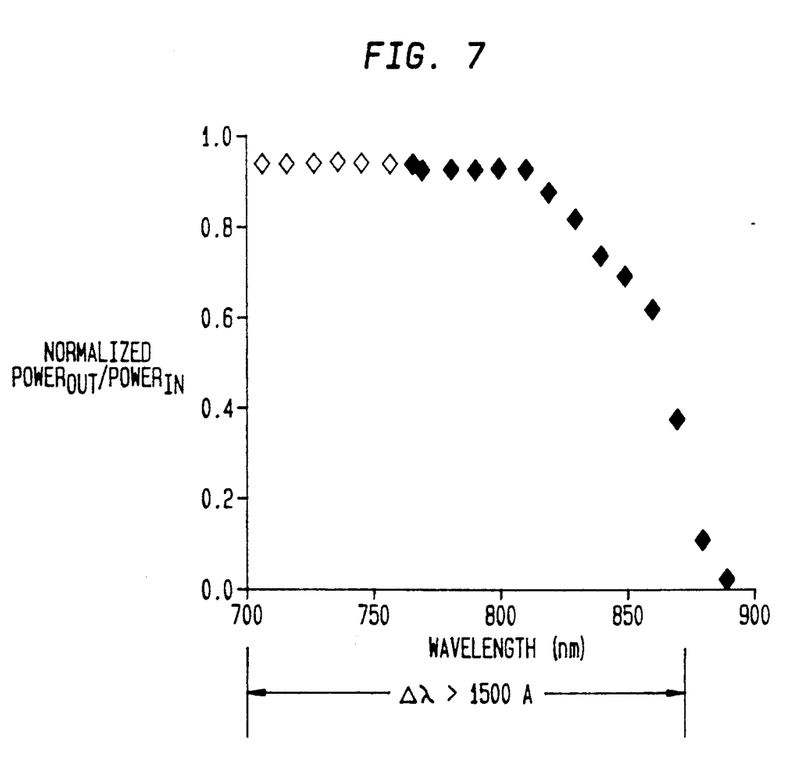
FIG. 7 is a plot of the spectral response for an exemplary heterojunction photo transistor used in the three dimensional optical interconnection of FIG. 1.

A further advantage of utilizing a HPT as the receiver is its characteristic flat spectral response, which is illustrated in FIG. 7. If the output wavelength of the VCSEL varies due to temperature variations, the receiver's response to the incident signal will be substantially unaffected and thus will be temperature insensitive.

Alternatively, the receiver can comprise a metal-semiconductor-metal (MSM) photodectector and a FET amplifier, monolithically integrated on substrate $60_i$.

Figure 8:
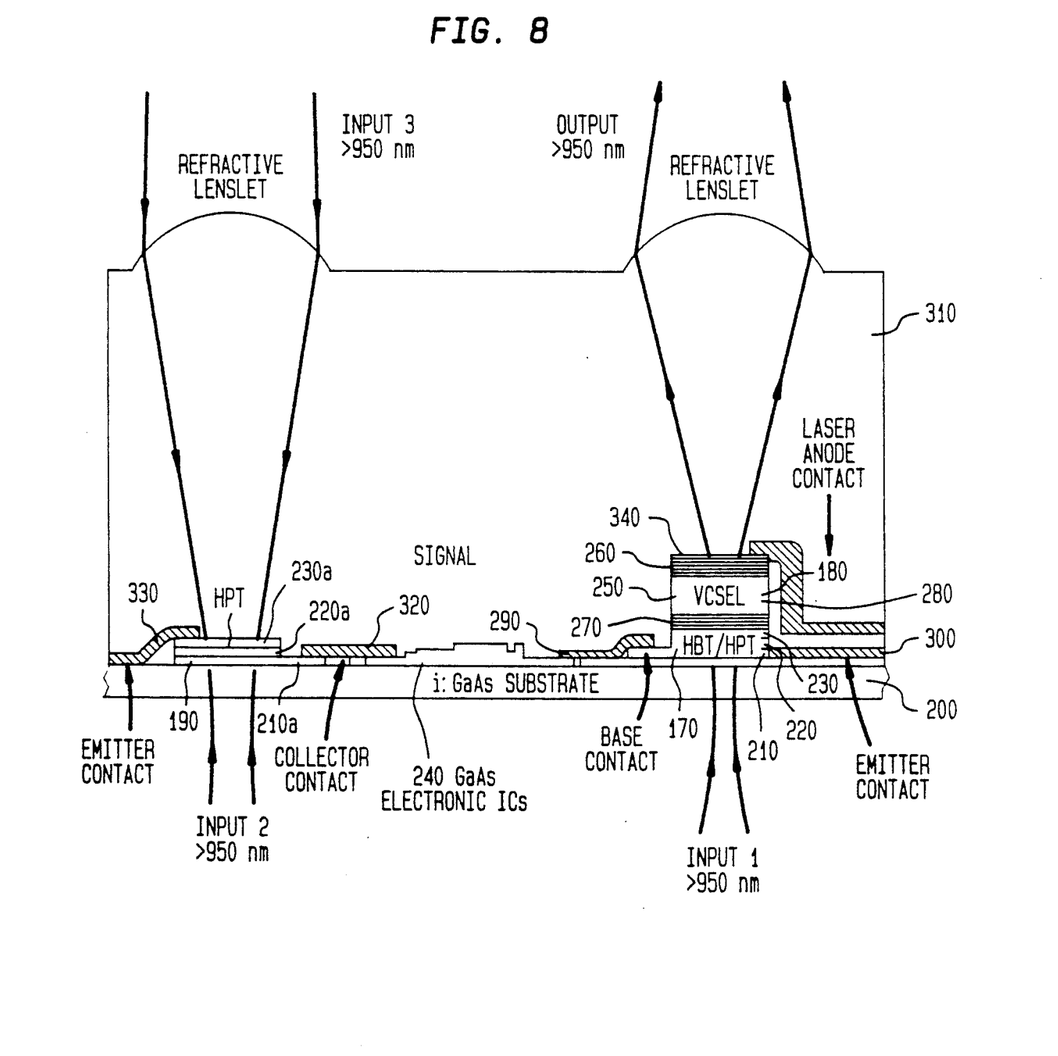
FIG. 8 is a cross section of a monolithically integrated heterojunction bipolar transistor, vertical cavity surface emitting laser and heterojunction photo transistor.

FIG. 8 depicts an exemplary monolithically integrated HBT 170, VCSEL 180 and HPT 190 in accordance with the principles of the invention. The exemplary embodiment is epitaxially grown on a planar GaAs substrate 200 made, for example, by a vertical gradient freeze technique. The collector, base and emitter layers comprise a n-AlGaAs layer 210, p-GaAs layer 220, and n-GaAs layer 230, respectively. Those skilled in the art will note that semiconductor layers 210, 220, and 230 form HBT 170. Importantly, the epitaxial layers of HBT 170 are grown over only a portion of the entire structure of GaAs substrate 200 so that other portions may be used to fabricate GaAs electronic integrated circuits 240. After the epitaxial layers of HBT 170 are deposited, the epitaxial layers of VCSEL 180 are grown over HBT 170.

In this exemplary embodiment, VCSEL 180 comprises laser cavity 250 sandwiched between distributed Bragg reflectors (DBRs) 260 and 270. The laser cavity includes active, optically emitting quantum well region 280 disposed between p-type conductivity DBR 260 and n-type conductivity DBR 270. DBRs 260 and 270 may be fabricated from alternating layers of quarter wavelength thick AlAs and AlGaAs (not shown).

After the growth of the HBT and VCSEL epilayers, wet chemical etching may be performed to realize individual mesas structure for each transmitter comprising a HBT and VCSEL. Those skilled in the art will know of chemical solutions to produce the transmitter mesa structure. With HPT 190 having the same epilayers as HBT 170, the VCSEL epilayers are etched from a portion of the mesa structure to form a pattern of HPTs around the perimeter of substrate 200. Additionally, the use of optical lithography and epitaxy deposition techniques may be used to fabricate the GaAs electronic logic 240.

Conventional ohmic contacts may be deposited on the lateral edges of HBT 170, HPT 190 and DBR 260 in order to provide ohmic contacts 290, 300 and 310 to emitter layer 210, base layer 220 and DBR 260, respectively, of HBT 170; and ohmic contacts 320 and 330 to emitter layer 210a and collector layer 230a of HPT 190, respectively. It is anticipated that before metalization, substrate 200 may be thinned and polished to enhance backside illumination from an adjacent OEIC module. Additionally, for VCSEL 180, an annular ohmic contact 340 facilities contact between contact 310 and DBR 260 while allowing egress of the emitted radiation. Annular ohmic contact 340 may be formed by standard photolithography, including evaporation and lift-off techniques which are well known in the art.

As illustrated in FIG. 8, optical radiation from adjacent OEIC modules, which have been indicated by input 1, input 2 and input 3, establish connectivity from each OEIC module. Optical radiation designated as "output" provides connectivity to the adjacent OEIC module. It should also be noted that to facilitate optical radiation to be received from an upper OEIC module, i.e., input 3, the upper OEIC module should utilize a "HBT-up" configuration which easily allows the output radiation to be emitted upward or downward. For a "HBT-up" configuration, the HBT is fabricated above the VCSEL.

Lenslet arrays may be also integrated with the VCSELs, HBTs and HPTs, as illustrated in FIG. 8. These lenslets may be refractive, diffractive or gradient index lens, and are used to more precisely control and direct the propagation of the emitting radiation from the VCSELs to the next OEIC module.

Calculations indicate that VCSEL based surface emitting optoelectronic interconnects have a significant advantage over edge-emitting lasers and LED based interconnects.

Figure 9:
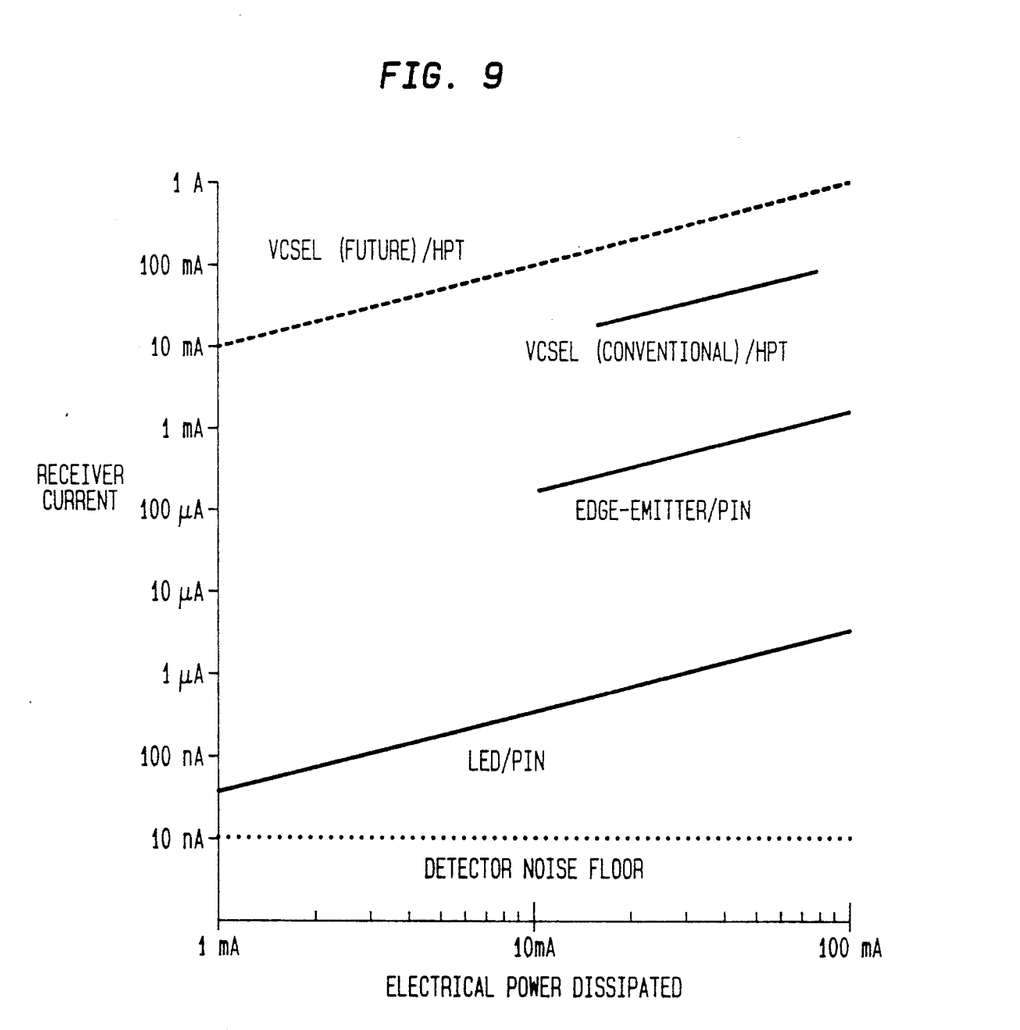
FIG. 9 is a plot of the current versus transmitter electrical power dissipation characteristic of various optoelectronic interconnection configurations.

Shown in FIG. 9 are plots of the current versus electrical power transmitter characteristics for LED/PIN, edge-emitting/PIN, VCSEL/HPT and VCSEL/FET interconnect configurations.

Typical optical efficiencies for LEDs, VCSELs, and edge-emitting lasers are 0.01, 0.04 and 0.5, respectively. As the efficiency of VCSELs increases because of improved design structures, the characteristic current versus transmitter electrical power dissipation should also improve as illustrated in the dashed line of FIG. 9.

Further calculations indicate that the interconnect efficiency or optical coupling efficiency for VCSEL based interconnects is significantly better than for either LEDs or edge-emitting lasers. For example, it is estimated that the interconnect efficiencies for LEDs, edge-emitting lasers and VCSELs are approximately 0.05, 0.1 and 0.5, respectively. The low interconnect efficiency of the LED based interconnects is due to the incoherent imaging employed, whereas the low efficiency for the edge-emitting lasers is due to the elliptical shape of the emitted laser radiation. Advantageously, VCSELs have optimum spatial beam profiles for interconnections to other optical devices for realizing the three dimensional optical interconnection of the present invention.

It should be understood that the present three dimensional interconnect architecture of the present invention may employ VCSELs fabricated from other semiconductors, such as GaInAsP/InP, InP/InGaAsP, AlGaAs/GaInP or InAlAs/InGaAsP, all of which may fabricated on a InP substrate. For these semiconductors, the VCSELS emit in the wavelength range of approximately 1.0–1.65 nm. Advantageously, InP is transparent for those wavelengths, allowing transmission and reception therethrough for establishing optical interconnectivity. Additionally, various other modifications may be made by those skilled in the art which embody the teachings of the invention and fall within the spirit and scope thereof.

What is claimed is:

1. A three dimensional optoelectronic interconnection comprising:
   a first semiconductor substrate having at least a first planar surface;
   a first array of vertical-cavity surface emitting lasers monolithically integrated in a first pattern on said first surface, each for generating radiation at a desired wavelength of operation, said radiation being emitted perpendicular to said first planar surface;
   means for generating a first set of electrical signals bearing information;
   for each laser, means responsive to said electrical signal for modulating said radiation to superimpose said information thereon;
   a second semiconductor substrate having at least a second planar surface, said first and second planar surfaces being non-coplanar;
   a first array of photoreceivers monolithically integrated in said first pattern on said second surface for receiving radiation from a corresponding laser and then converting said radiation to a second set of electrical signals; and
   means for processing said second set of electrical signals,
   at least one of said first and second semiconductor substrates being substantially transparent at said desired wavelength of operation, whereby the transmission and reception of said radiation between said lasers and photoreceivers establish an optoelectronic interconnection between said means for generating and said means for processing.

2. The three dimensional optoelectronic interconnection of claim 1 wherein said means for generating includes GaAs logic.

3. The three dimensional optoelectronic interconnection of claim 2 wherein said GaAs logic is monolithically integrated on said first surface.

4. The three dimensional optoelectronic interconnection of claim 1 wherein said means for modulating includes heterojunction bipolar transistors, each monolithically integrated with a corresponding laser.

5. The three dimensional optoelectronic interconnection of claim 1 wherein said first array of photoreceivers includes heterojunction photo transistors, each monolithically integrated on said second semiconductor substrate.

6. The three dimensional optoelectronic interconnection of claim 1 wherein said means for processing includes GaAs logic devices.

7. The three dimensional optoelectronic interconnection of claim 6 wherein said GaAs logic devices are monolithically integrated on said second surface.

8. The three dimensional optoelectronic interconnection of claim 1 wherein said first semiconductor substrate is GaAs.

9. The three dimensional optoelectronic interconnection of claim 1 wherein said second semiconductor substrate is GaAs.

10. The three dimensional optoelectronic interconnection of claim 1 wherein said vertical-cavity surface emitting lasers include an active region having at least one quantum well region.

11. The three dimensional optoelectronic interconnection of claim 10 wherein said quantum well region includes first and second layers, said first layers comprising a wide bandgap semiconductor material, said second layers comprising a narrow bandgap semiconductor material, and said first layers interleaved with said second layers.

12. The three dimensional optoelectronic interconnection of claim 11 wherein said quantum well region includes a compound selected from the group consisting of GaAs/AlGaAs, GaAs/InGaAs, AlGaAs/GaInP, InP/InGaAsP, or InAlAs/InGaAsP.

13. The three dimension optoelectronic interconnection of claim 1 wherein the wavelength of radiation is greater than 0.88 $\mu$m.

14. A three dimensional optoelectronic interconnection comprising
   a plurality of optoelectronic integrated circuit (OEIC) modules arranged in a vertical configuration such that each of said OEIC modules defines a planar surface substantially parallel with each other,
   each of said OEIC modules having at least a transmitter and a receiver,
   said transmitter including a heterojunction bipolar transistor (HBT) having collector, base and emitter semiconductor layers formed on said planar surface, and a vertical cavity surface emitting laser (VCSEL) for generating optical radiation at a desired wavelength of operation so that the transmission of the optical radiation from one OEIC module to a receiver on another OEIC module establishes an optoelectronic interconnection therebetween, at least one of said OEIC modules being substantially transmissive at said desired wavelength of operation, said VCSEL including, first and second mirrors, said first mirror disposed on said HBT, and an active quantum well region disposed between said first and second mirrors, said receiver including a heterojunction photo-transistor (HPT) having collector and emitter semiconductor layers and a floating base semiconductor layer for receiving said optical radiation, wherein said collector, emitter and floating base semiconductor layers, respectively, have the same epitaxial structure as said collector, emitter, and base semiconductor layers of said HBT.

15. The three dimensional optoelectronic interconnection of claim 14 wherein said OEIC module further includes a semiconductor substrate, said transmitter and receiver monolithically integrated on said substrate.

16. The three dimensional optoelectronic interconnection of claim 15 wherein said OEIC module further includes a lens monolithically integrated on said substrate for directing the propagation of the optical radiation from said laser.

17. The three dimensional optoelectronic interconnection of claim 14 wherein the OEIC module further includes means for modulating the optical radiation from said laser.

18. A three dimensional optoelectronic interconnection comprising:

first and second planar semiconductor substrates substantially parallel with each other;

an array of transmitters including vertical cavity surface emitting lasers (VCSELs) and transistors disposed on said first semiconductor substrate for generating optical radiation at a desired wavelength of operation, said radiation being emitted perpendicular to said first semiconductor substrate; and an array of photoreceivers disposed on said second semiconductor substrate for receiving the optical radiation from said lasers so that the transmission and reception of the optical radiation establish an optical interconnection, at least one of said first and second semiconductor substrates being substantially transparent at said desired wavelength of operation, wherein the photoreceivers and transistors each have three semiconductor layers, the respective layers of said photoreceivers and transistors having the same epitaxial structure.

19. The three dimensional optoelectronic interconnection of claim 18 wherein said vertical cavity surface emitting laser is monolithically integrated on said first substrate and said means for receiving is monolithically integrated on said second semiconductor substrate.

20. The three dimensional optoelectronic interconnection of claim 18 further comprising means disposed on said first substrate for modulating the optical radiation from said laser, and a lens disposed on said second substrate for focusing the optical radiation from said laser to said means for receiving.

21. The three dimensional optoelectronic interconnection of claim 20 wherein said means for modulating is monolithically integrated on said first substrate and said lens is monolithically integrated on said second substrate.

22. The three dimensional optoelectronic interconnection of claim 21 further comprising a lens monolithically integrated on said first substrate for directing said optical radiation from said laser to said means for receiving.

* * * * *